United States Patent [19]
Berkner

[11] 3,931,026
[45] Jan. 6, 1976

[54] ELECTRICALLY INSULATING ENCAPSULATING COMPOSITION FOR SEMICONDUCTOR DEVICES

[75] Inventor: Rolf Berkner, Wolkersdorf, Germany

[73] Assignee: Semikron Gesellschaft fur Gleichrichterbau und Elektronik m.b.H., Nurnberg, Germany

[22] Filed: Dec. 22, 1972

[21] Appl. No.: 319,925

[52] U.S. Cl. ............. 252/63.2; 252/63.5; 252/63.7; 252/64; 252/65; 252/67
[51] Int. Cl.² .......................................... H01B 3/00
[58] Field of Search .......... 252/63.2, 63.5, 63.7, 64, 252/65, 66

[56] References Cited
UNITED STATES PATENTS

| | | | |
|---|---|---|---|
| 3,141,850 | 7/1964 | Lybeck | 252/63.5 X |
| 3,287,311 | 11/1966 | Edwards | 252/63.5 |
| 3,429,906 | 2/1969 | Swigar et al. | 252/63.5 |

*Primary Examiner*—Stephen J. Lechert, Jr.
*Attorney, Agent, or Firm*—Spencer & Kaye

[57] ABSTRACT

An electrically insulating composition adapted for the encapsulation of a semiconductor body and for protecting the semiconductor surface against harmful impurities, comprising a mixture of a polymerizable organic resin, at least one filler which improves the electrical properties of the semiconductor body, and at least one organic chelating agent capable of binding undesirable impurities in said resin and in said filler.

25 Claims, No Drawings

ELECTRICALLY INSULATING ENCAPSULATING COMPOSITION FOR SEMICONDUCTOR DEVICES

BACKGROUND OF THE INVENTION

In known embodiments of semiconductor rectifying systems, particularly those having high reverse voltage handling capability, and which include at least one semiconductor body, the semiconductor body is customarily completely encased in an insulating material. The insulating material may be either a molded or cast mass, and consists of at least one organic base material, preferably a resin, together with fillers, such as, for example, quartz flour or aluminum oxide, primarily to improve the thermal operating characteristics of the material.

The surface of the semiconductor body not intended to be contacted is thus specially provided with a protective coating in the vicinity of the outlet of the p-n junction, said coating consisting, for example, of the oxide of the semiconductor material, or of a protective lacquer made from organic vehicles and special additives. This coating is intended to offset the harmful influence of undesirable impurities in the form of atoms, ions or molecules disposed on the semiconductor surface or in the surrounding atmosphere, on the biasing ability of such semiconductor devices.

The insulating material required after making such insulating and/or stabilizing coatings in order to encapsulate the semiconductor body is specifically determined, with reference to its composition and properties, by the requirements placed on housings for semiconductor devices.

In connection with the requirement for more and more economical embodiments of semiconductor rectifier systems, the use of insulating materials serving to encapsulate semiconductor bodies and simultaneously suited to protect the semiconductor surface in order to optimize the blocking behavior, result in a significant economic advantage since special process steps for the so-called surface stabilization are eliminated.

The problem of producing encapsulation masses having stabilizing properties has been described in German Auslegeschrift (Published Patent Application) No. 1,903,098. This publication discloses an electrically insulating epoxy resin encapsulation material for semiconductor devices which material consists of an unhardened epoxy resin, an amine, phenol or anhydride hardener, an additive in the form of an organic silicon compound, i.e. a lower alkyl, alkoxy silane, having a low degree of polymerization and, if required, an inorganic filler, and is also intended to effect a passivating surface treatment of the semiconductor devices.

It has been found, however, that such known, so-called silanized insulating materials produce the desired surface stabilization only for transistors, but for semiconductor devices having a reverse voltage carrying capability higher by one or two orders of magnitudes than that of transistors they can no longer effect such stabilization.

It is therefore the object of the present invention to produce insulating materials for encapsulating semiconductor bodies for rectifier systems having a high reverse voltage carrying capability and for protecting the semiconductor surface against undesirable impurities.

SUMMARY OF THE INVENTION

The present invention relates to an electrically insulating encapsulation medium for semiconductor systems comprising a mixture of a polymerizable and/or condensable organic base substance and at least one filler which improves the electrical properties of the devices and at least one additive and consists in that the additive is provided as at least one organic substance which stabilizes the semiconductor surface by the formation of chelates with undesirable impurities.

The basic ingredients for the encapsulation material of the present invention are, for example, phenolic resins, alkyd resins, polyester resins, silicone resins, epoxide resins and diallylphthalate resins. Their electrical properties generally meet the established specifications, while for the required improvement of various specific physical properties, such as, the thermal operating performance, of the devices and components imbedded in such substances, these resinous substances can have added to them in conventional manner, so-called fillers in a quantity up to about 70 percent by weight. Suitable fillers for this purpose are, for example, quartz meal, chalk meal and a variety of metal oxides, such as aluminum oxide and beryllium oxide.

DETAILED DESCRIPTION OF THE INVENTION

According to the present invention such fillers are mixed with organic additives before they are added to the basic resinous substances. These additives bind ionized impurities, for example, by the so-called chelate formation, so that the deleterious influence of the undesirable impurities disposed on the semiconductor surface, in its vicinity, in the fillers or in the resins, is avoided.

Consequently, impurities contained in the fillers can also not exert any unfavorable influence on the resins or on the semiconductor material so that the necessity of using highly pure and thus very expensive fillers is not necessary.

The selection of the chelate forming additive depends on the process temperatures during the production stages and on the temperatures during use of the intended semiconductor system, as well as on the type of impurities encountered which are primarily deposited on the semiconductor surface during the removal, cleansing and contacting processes, or which may be contained in the basic resinous substances and fillers as a result of their manufacturing processes, as well as on the solubility in a solvent or in one of the intended basic substances to produce a desired mixture. The proportion of the chelating additive is determined by the saturation of the quantity of the respective filler and may be as high as 10 percent by weight with reference to the weight of the filler. The proportion can go as low as 0.02 %.

Suitable chelate forming additives are, for example, organic chelating agent, suitable as derivatives of fluorone, e.g. gallein, resorcinbenzein; derivatives of xanthone, e.g. euxanthone, ravenillin; derivatives of cumarin, e.g. esculetin, ellagic acid; derivatives of chromone, e.g. flavones, isoflavones; derivatives of quinoline, e.g. quinaldinic acid, cuproin; derivatives of triarylmethane, e.g. phenolphthalein, aurin, eriocromcyanin; derivatives of quinone, e.g. naphthoquinone, anthraquinone; derivatives of phenoxazine, e.g. gallocyanine; derivatives of thiazolidin, e.g. rhodanine; derivatives of imidazolone; derivatives of pyrazolone; derivatives of squaric acid, e.g. 3-hydroxy-1,2,3-triresorcyl-cyclobutenone-(4), derivatives of porphyrin and of phthalocyanine as well as the azo coloring agents, the azomethine and the azine coloring agents.

A further aspect of the present invention consists in employing together with the chelate forming additives, strongly surface-active fillers. Thereby the additive as well as impurities are adsorptively bound and undesirable reactions of impurities occurring in the fillers with the basic substances are substantially prevented. Moreover, the effect of the surface binding forces of such strongly adsorptive fillers serves to reduce the proportion of chelate forming additives which can be used only in a highly pure form.

Such strongly surface active fillers include, for example, highly dispersed silicic acids, metal oxides, calcium carbonate, calcium sulfate or calcium silicate. Usually the active surface of the various modifications of such fillers is known so that by once adding an additive to a first such filler the required proportion of the same additive for another filler can be determined from the ratio of the surface of the first filler to that of the other filler.

To produce the encapsulating materials of the present invention, the chelating additive is initially dissolved in a solvent, such as for example galleine in alcohol. The filler selected for intended admixture is then introduced into this solution, preferably in a surface active form and as finely divided as possible. After adsorption of the additive on the filler particles the filler solution is filtered. The then present quantity of finegrained filler to which is the solvent still adheres and which at least partially covered with the additive is dried by heating to above the boiling point of the solvent or in a vacuum. The processing can now be carried in a known manner in that the thus pretreated filler is mixed with a thin-flowing resin which is available for example in a prepolymerized or precondensed state for the production of molded masses. The thus resulting mass is heated in order to remove gases and then strongly cooled in order to convert it into a vitreous hard state and is then ground into a powder or granulate for the further processing in measured amounts.

The encapsulation of semiconductor bodies by means of press molds is then effected, for example, in that the granular encapsulation mass is introduced into a container, is heated therein until it softens or becomes plastic and is then injected into the mold under pressure and in metered quantities, whereupon it hardens in the mold at the appropriate temperature.

Resins and additives may also be processed in a known manner by the addition of hardening agents and polymerization initiating or accelerating substances to produce casting masses in which the components are embedded by conventional casting techniques.

There further exists the possibility of first introducing an additive which is soluble in the selected resinous ingredient into this substance, and then admixing the filler therewith.

The chelate forming additive is able by adsorption on the filler, to chelate impurities in the form of ions or atoms which are bound to the filler or, when it is added to the resinous substance, it can form a chelate bond with the impurities contained in the resinous substance. Moreover, based on the relatively large quantity of additive compared to the respective proportion of impurities to be bound, a further chelate forming effect with foreign ions is possible, particularly on the semiconductor surface.

The additives according to the present invention, which exhibit a high thermal stability, at the temperatures encountered in use of the intended semiconductor devices, as well as high purity, form stable chelates with the impurities which chelates exhibit comparably higher thermal stability, and thus forming no undesirable reaction with the basic substance.

The change in the dipole moment and/or the dielectric constant of the encapsulation mass connected with the chelate formation does not have any adverse effect on the electrical behavior of the encapsulation mass.

If desired, two or more chelate forming additives may be admixed at the same time, one of which for example, binds the foreign ions disposed on the semiconductor surface, and the other additive or additives forms chelates with the impurities of the filler and/or the resinous substance. Thus, all impurities which may occur in the production of the semiconductor bodies and their contact portions as well as in the production of the encapsulation masses, and which are well known to the person skilled in the art can thus be made ineffective by a chemical bond.

The advantages of the present invention are mainly that special measures for the stabilizing surface treatment of semiconductor bodies before their encapsulation are eliminated and the undesirable impurities disposed on the semiconductor surface and in the encapsulation mass are bound, thus removing their influence on the blocking behavior. Furthermore, the use of strongly adsorbing fillers permits a reduction in the amounts of the chelate forming additives used.

DESCRIPTION OF THE PREFERRED EMBODIMENTS

The following examples serve to illustrate several presently preferred embodiments of the invention in the form of particular compositions. The respective resin may exist in a solid or liquid condition which depends on structure and the degree of polymerization or condensation. Its mixture with a hardener is stated by the producers and is not object of this invention. The hardener also may be solid or liquid.

At production of encapsulation compounds according to this invention and as it is mentionned for example subsequently, at first resin and hardener are moulten seperately, then fillers and additives and finally the hardener are admixed to the liquid resin. For use as molding compound the mixture is kept on a temperature determined by the features of the resin for a longer time and is changed thereby in a gel-like condition, the so-called B-condition, until resin and hardener will have reacted. After that, the mixture is cooled down and e.g. pulverized. For processing as encapsulation compound then it is changed into the molecular final condition under pressure at corresponding temperature and preferentially by means of catalysts. These known procedural steps do not belong to this invention and are not further explained.

If such a mixture is used as casting compound so it is processed in a liquid condition after addition of all components at a correspondingly high temperature at which the reaction between resin and hardener must be reached in a very short time. Consequently the mixture is to be changed very rapidly from the beginning condition into the molecular final condition.

If resin and hardener are liquid at first the different additions and then the liquid hardener are admixed to the liquid resin. For the further processing the above explanations are applicable.

The sealing of semiconductor bodies may now follow in the way that these ones are either put into a mold, pressed around with the composition according to invention or arranged in a housing at use of the casting technique and embedded into the composition by means of casting the same into the housing. With the known resins provided according to invention molding or casting masses may be produced while silicone rubber is applicable only as casting mass.

EXAMPLE 1

Bisphenol A-epoxy resin as organic base substance is mixed with calciumcarbonate powder as filler in such quantities that, with regard to the necessary addition of an anhydride hardener mentionned by the resin producer, a mixing ratio of 30 per cent of weight resin with hardener to 67 per cent of weight filler is given. To this mixture 3 per cent of weight of the ellagic acid, a cumarin derivative, are added.

EXAMPLE 2

Epoxynovolake resin as base substance is mixed with silicid acid powder as a first filler and aluminum silicate powder as a second filler in such quantities that, with regard to the necessary addition of an anhydride hardener, a mixing ratio of 30 per cent of weight resin with hardener to 48 per cent of weight of the said first filler and to 20 per cent of weight of the said second filler is given. To this mixture 2 per cent of weight 9-phenyl-2,3,7-trihydroxy-6-fluorone, a derivate of fluorone, are added which is forming chelates especially with metallic impurities of lead, molybdenum, tin and antimony.

EXAMPLE 3

Silicone resin as base substance is mixed with silicid acid powder as filler in such a quantity that, with regard to the necessary quantity of a peroxide hardener, a mixing ratio of 27 per cent of weight resin and hardener to 70 per cent of weight filler is existing. To this mixture 3 per cent of weight 5-(4-dimethylaminobenzalrhodanin) as a thiazolidin derivative are added which is acting as chelate former e.g. for silver, gold, copper, mercury.

EXAMPLE 4

Bisphenol A-resin and epoxynovolake resin as components of the base substance are added with alumina as filler in such a quantity that, with regard to the necessary quantity of $BF_3$-amincomplex as hardener, a mixing ratio of 15 per cent of weight of the first basic substance component to 16 per cent of weight of the second basic substance component to 68 per cent of weight of the filler is existing. To this mixture 1 per cent of weight gallocyanine as a phenoxazine derivative is added.

EXAMPLE 5

Polyimide resin as pre-polymerized base substance is mixed with silicid acid powder as filler in a ratio of 35 to 64,5 per cent of weight. To this mixture 0,5 per cent of weight of metal-free phthalocyanine are added for chelating especially with iron, copper, nickel, cobalt, platinum.

EXAMPLE 6

Silicone rubber as base substance is mixed with silicid acid powder as filler in such a quantity that, at addition of a corresponding portion of amine hardener, a mixing ratio of 40 per cent of weight rubber with hardener to 59 per cent of weight filler is given. To this mixture 1 per cent of weight 4,5-diphenyl-imidazolon (−2) is admixed.

EXAMPLE 7

45 per cent of weight polyamidimide resin as pre-polymerized base substance are mixed with 53 per cent of weight alumina as filler. Then, 2 per cent of weight auritricarbon acid are admixed for chelating especially with aluminum and copper.

EXAMPLE 8

Epoxynovolake resin as base substance is mixed with silicid acid powder as filler in such a quantity that, with regard to the necessary quantity of an anhydride hardener, a mixing ratio of 32 per cent of weight resin with hardener to 67 per cent of weight filler is existing. To this mixture 1 per cent of weight 3-hydroxy-1,2,3-triresorcyl-cyclobutenon-(4), a squaric acid derivative, is admixed.

Instead of the derivative of squaric acid in the mixture according to example 8 e.g. 5,7,4'-trihydroxyflavone (apigenin) as a chromone derivative or e.g. 1,5-dihydroxy anthraquinone (anthrarufin) as a quinone derivative or e.g. 2,2'-biquinoline (cuproin) as a derivative of quinoline or e.g. 1,3,6-trihydroxyxanthone or e.g. glyoxal-bis-(2-hydroxyanil) as a derivative of the azomethine coloring agents can be used. The portion of the mentioned chelate formers can be substantially lower as 1 per cent of weight at a respective high portion of the base substance and the filler.

It will be understood that the above description of the present invention is susceptible to various modifications, changes and adaptations, and the same are intended to be comprehended within the meaning and range of equivalents of the appended claims.

I claim:

1. An electrically insulating composition adapted for the encapsulation of a semiconductor body and for protecting the semiconductor surface against harmful impurities, comprising a mixture of:
   a. a polymerizable and/or condensable organic resin;
   b. at least one filler which improves the electrical properties of the semiconductor body; and
   c. at least one organic chelating agent which binds undesirable impurities in said resin and in filler, the amount of said chelating agent being sufficient to bind undesirable impurities on the surface of said semiconductor body when said composition is applied to said semiconductor body after formation of said composition.

2. The composition of claim 1 in which the proportion of said filler is up to 70% by weight.

3. The composition of claim 1 in which the proportion of chelating agent is between about 0.02% and about 10% by weight with reference to the weight of the filler.

4. The composition of claim 1 in which the filler is a surface-active substance selected from the group consisting of a metal oxide, silicic acid and a calcium salt.

5. The composition of claim 1 in which said resin is chosen from the group consisting of the epoxy resins.

6. The composition of claim 1 in which said resin is chosen from the group consisting of the epoxynovolake resins.

7. The composition of claim 1 in which said resin is chosen from the group consisting of the polyimide resins.

8. The composition of claim 1 in which said resin is chosen from the group consisting of the silicone resins.

9. The composition of claim 1 in which said organic chelating agent is chosen from the group of fluorone derivatives having chelate-forming substituents.

10. The composition of claim 1 in which said organic chelating agent is chosen from the group of xanthone derivatives having chelate-forming substituents.

11. The composition of claim 1 in which said organic chelating agent is chosen from the group of cumarin derivatives having chelate-forming substituents.

12. The composition of claim 1 in which said organic chelating agent is chosen from the group of chromone derivatives having chelate-forming substituents.

13. The composition of claim 1 in which said organic chelating agent is chosen from the group of quinoline derivatives having chelate-forming substituents.

14. The composition of claim 1 in which said organic chelating agent is chosen from the group of triarylmethane derivatives having chelate-forming substituents.

15. The composition of claim 1 in which said organic chelating agent is chosen from the group of quinone derivatives having chelate-forming substituents.

16. The composition of claim 1 in which said organic chelating agent is chosen from the group of phenoxazine derivatives having chelate-forming substituents.

17. The composition of claim 1 in which said organic chelating agent is chosen from the group of thiazolidin derivatives having chelate-forming substituents.

18. The composition of claim 1 in which said organic chelating agent is chosen from the group of imidazolone derivatives having chelate-forming substituents.

19. The composition of claim 1 in which said organic chelating agent is chosen from the group of pyrazolone derivatives having chelate-forming substituents.

20. The composition of claim 1 in which said organic chelating agent is chosen from the group of squaric acid derivatives having chelate-forming substituents.

21. The composition of claim 1 in which said organic chelating agent is chosen from the group of porphyrin derivatives having chelate-forming substituents.

22. The composition of claim 1 in which said organic chelating agent is chosen from the group of phthalocyanine derivatives having chelate-forming substituents.

23. The composition of claim 1 in which said organic chelating agent is chosen from the group of azo coloring agent derivatives having chelate-forming substituents.

24. The composition of claim 1 in which said organic chelating agent is chosen from the group of azomethine coloring agent derivatives having chelate-forming substituents.

25. The composition of claim 1 in which said organic chelating agent is chosen from the group of azine coloring agent derivatives having chelate-forming substituents.

* * * * *

UNITED STATES PATENT AND TRADEMARK OFFICE
CERTIFICATE OF CORRECTION

PATENT NO. : 3,931,026

DATED : January 6th, 1976

INVENTOR(S) : Rolf Berkner

It is certified that error appears in the above—identified patent and that said Letters Patent are hereby corrected as shown below:

In the heading of the patent, after "Appl. No.: 319,925" insert --[30] Foreign Application Priority Data Dec. 23, 1971 Germany 2164100--

Column 3, line 33, change "finegrained" to --fine-grained--; line 34, delete "is"; line 35, after "which" insert --is--.

Column 5, line 65, change "64,5" to --64.5--; same line, change "0,5" to --0.5--.

Signed and Sealed this fourth Day of May 1976

[SEAL]

Attest:

RUTH C. MASON
*Attesting Officer*

C. MARSHALL DANN
*Commissioner of Patents and Trademarks*